(12) United States Patent
Zeman et al.

(10) Patent No.: US 8,441,091 B2
(45) Date of Patent: May 14, 2013

(54) PHOTOSENSOR ASSEMBLY AND METHOD FOR PROVIDING A PHOTOSENSOR ASSEMBLY

(75) Inventors: Gregory Scott Zeman, Waukesha, WI (US); Jeffrey Kautzer, Waukesha, WI (US); Faisal Saeed, Waukesha, WI (US)

(73) Assignee: General Electric Company, Schenectady, NY (US)

( * ) Notice: Subject to any disclaimer, the term of this patent is extended or adjusted under 35 U.S.C. 154(b) by 22 days.

(21) Appl. No.: 12/963,854

(22) Filed: Dec. 9, 2010

(65) Prior Publication Data
US 2012/0146174 A1  Jun. 14, 2012

(51) Int. Cl.
*H01L 27/146* (2006.01)
(52) U.S. Cl.
USPC .................. 257/446; 257/292; 257/E27.129
(58) Field of Classification Search ............... 257/292, 257/462, 233, 446, 431, E27.129, E31.055
See application file for complete search history.

(56) References Cited

U.S. PATENT DOCUMENTS

| 7,170,143 | B2 | 1/2007 | Yamanaka | |
|---|---|---|---|---|
| 2002/0121655 | A1* | 9/2002 | Zheng et al. | 257/291 |
| 2005/0082630 | A1* | 4/2005 | Yamanaka | 257/461 |

* cited by examiner

*Primary Examiner* — Phat X Cao
*Assistant Examiner* — Nga Doan
(74) *Attorney, Agent, or Firm* — The Small Patent Law Group; Dean D. Small (57) ABSTRACT

A photodiode assembly includes a semiconductor substrate, a photodiode cell, a ground diffusion region, and a guard band. The photodiode cell includes a first volume of the substrate doped with a first type of dopant. The diffusion region includes a second volume of the substrate that is doped with a second, opposite type of dopant. The guard band is disposed in the substrate and at least partially extends around an outer periphery of the photodiode cell. The guard band includes a third volume of the substrate that is doped with the first type of dopant. At least one of the ground diffusion region or the guard band is conductively coupled with a ground reference to conduct one or more of electrons or holes that drift from the photodiode cell through the substrate. The guard band is disposed closer to the photodiode cell than the ground diffusion region.

13 Claims, 6 Drawing Sheets

PHOTOSENSOR ASSEMBLY AND METHOD FOR PROVIDING A PHOTOSENSOR ASSEMBLY

BACKGROUND OF THE INVENTION

The subject matter described herein relates to semiconductor devices, such as photodiodes and photosensors.

Some known imaging systems include photosensitive detectors that receive incident radiation, such x-rays, to generate an image. The radiation is received by photodiodes in the detector and is converted into an electric charge or signal. The magnitude of the charge or signal can represent the amount of attenuation of the incident radiation and be used to generate an image.

In order to provide images with relatively high resolution, the photodiodes in the detector may need to be positioned relatively close to each other. The photodiodes can generate electrical signals that are not representative of the radiation received by the individual photodiodes. These signals are referred to as electrical crosstalk. The crosstalk can drift through the photodiode array in the form of electrons and electron holes (e.g., the absence of electrons at lattice points in the semiconductor structure of a detector). The crosstalk may drift from one cell of a photodiode array to another nearby cell within the same photodiode array and alter the charge or signal generated by the photodiode in response to receiving incident radiation. As a result, the image generated by the photodiodes may be negatively impacted by the crosstalk.

Some detectors include areas of a semiconductor substrate that are heavily doped with n+ dopants, such as phosphorus (P), in order to make the substrate more conductive. These areas attempt to prevent crosstalk from drifting between cells of the photodiode array by conducting the electrons of the crosstalk out of the photodiode array. However, the use of n+ doped regions can reduce the amount of crosstalk that is removed from the detector. For example, the n+ doped regions may reflect part of the crosstalk, such as the electron holes of the crosstalk, back toward the photodiode cells instead of conducting the electron holes out of the detector. As a result, at least some of the crosstalk may continue to drift to the photodiodes and degrade image quality.

BRIEF DESCRIPTION OF THE INVENTION

In one embodiment, a photodiode assembly is provided. The assembly includes a semiconductor substrate, a photodiode cell, a ground diffusion region, and a guard band. The photodiode cell in disposed the substrate and includes a first volume of the substrate that is doped with a first type of dopant. The ground diffusion region is disposed in the substrate and includes a second volume of the substrate that is doped with a second type of dopant having an opposite charge relative to the first type of dopant. The guard band is disposed in the substrate and at least partially extends around an outer periphery of the photodiode cell. The guard band includes a third volume of the substrate that is doped with the first type of dopant. At least one of the ground diffusion region or the guard band is conductively coupled with a ground reference to conduct one or more of electrons or holes that drift from the photodiode cell through the substrate. The guard band is disposed closer to the photodiode cell than the ground diffusion region.

In another embodiment, a method for providing a photodiode assembly is provided. The method includes diffusing a first type of dopant into a first volume of a substrate to form a photodiode cell and forming a ground diffusion region in the substrate by diffusing a second type of dopant into the substrate. The first and second types of dopants are oppositely charged dopants. The method also includes forming a guard band in the substrate that at least partially extends around an outer periphery of the photodiode cell. The guard band is formed by diffusing the first type of dopant into a collection region of the substrate and is disposed closer to the photodiode cell than the ground diffusion region. At least one of the ground diffusion region or the guard band is conductively coupled with a ground reference to conduct one or more of electrons or holes that drift from the photodiode cell through the substrate.

In another embodiment, another photodiode assembly is provided. The assembly includes a semiconductor substrate, an array of photodiode cells, guard bands, and ground diffusion regions. The array of photodiode cells is disposed in the substrate and includes spaced apart volumes of the substrate that are doped with a first type of dopant. The guard bands are disposed in the substrate between the photodiode cells and include commonly doped volumes of the substrate that are doped with the first type of dopant. The ground diffusion regions are disposed in the substrate farther from the photodiode cells than the guard bands and are doped with a different, second type of dopant than the first type of dopant. The guard bands are configured to conduct at least one of electrons or holes drifting through the substrate from the photodiode cells to a ground reference and the ground diffusion regions are configured to conduct the other of electrons or holes drifting through the substrate from the photodiode cells to the ground reference.

BRIEF DESCRIPTION OF THE DRAWINGS

The presently disclosed subject matter will be better understood from reading the following description of non-limiting embodiments, with reference to the attached drawings, wherein below.

DETAILED DESCRIPTION

As used herein, an element or step recited in the singular and proceeded with the word "a" or "an" should be understood as not excluding plural of said elements or steps, unless such exclusion is explicitly stated. Furthermore, references to "one embodiment" of the invention do not exclude the existence of additional embodiments that also incorporate the recited features. Unless explicitly stated to the contrary, embodiments "comprising," "including," or "having" an element or a plurality of elements having a particular property may include additional such elements not having that property.

The subject matter described herein relates to photosensor assemblies used in imaging systems. The photosensor assemblies may be used to generate images based on incident radiation. For example, the photosensor assemblies may be used with a computed tomography (CT) system to convert incident radiation into an image. Alternatively, the photosensor assemblies may be used with security systems to convert incident radiation into an image or to detect the presence of a body, such as that of an intruder. However, not all embodiments described herein are limited to CT systems or security systems. Other systems or apparatuses that convert radiation into electrical signals for forming images or for other purposes may include one or more embodiments described herein.

The photosensor assemblies include substrates having photodiode cells disposed therein that convert the incident radiation into electric signals or charges that are used to form the image. Dopants are diffused into the substrates between the photodiode cells along the interior of the substrate (e.g., not along the exterior boundary in one embodiment) to form guard bands and ground diffusion regions. The guard bands and the ground diffusion regions are provided in the photodiode assembly to prevent or reduce electrons and/or holes generated in or near one photodiode cell from drifting to another neighboring photodiode cell. Such drift of electrons and/or holes may otherwise change the signal or charge generated by the neighboring photodiode cell.

The guard bands may attract and/or accept the holes that drift from the photodiode cells while the ground diffusion regions can repel the holes toward the guard bands. The ground diffusion regions can attract and/or accept the electrons the drift from the photodiode cells. The guard bands and the ground diffusion regions may be conductively coupled with each other and the ground diffusion regions may be conductively coupled with an electric ground reference. For example, the guard bands and the ground diffusion regions may be conductively coupled to a common electrode or bus. The guard bands and ground diffusion regions conduct the electrons and holes to the ground reference before the electrons and holes reach a nearby or neighboring photodiode cell.

In one embodiment, the guard bands may include hole collection regions of the substrate that are doped with the same dopant or same type of dopant ("commonly doped regions) as the photodiode cells. The ground diffusion regions may include electron collection regions of the substrate that are doped with a different dopant or different type of dopant ("differently doped regions"). For example, if the photodiode cells are formed from p– or p+ doped regions of an n-doped semiconductor substrate, then the ground diffusion regions may be formed from n or n+ doped regions of the semiconductor substrate that collects or accepts electron holes, or the absence of an electron in the semiconductor lattice of the substrate, that drift through the substrate as an electrical component of crosstalk. The holes and/or electrons are conducted through the guard bands and/or the ground diffusion regions to the electric ground reference and prevented from drifting to another photodiode cell.

Figure 1:
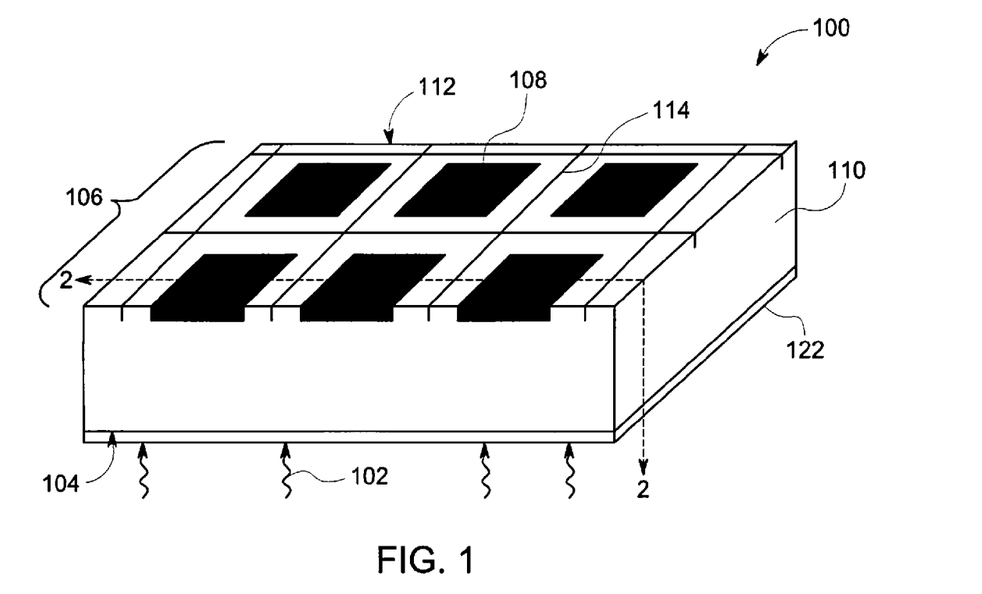
FIG. 1 is a perspective view of one embodiment of a portion of a photodiode assembly.
Figure 2:
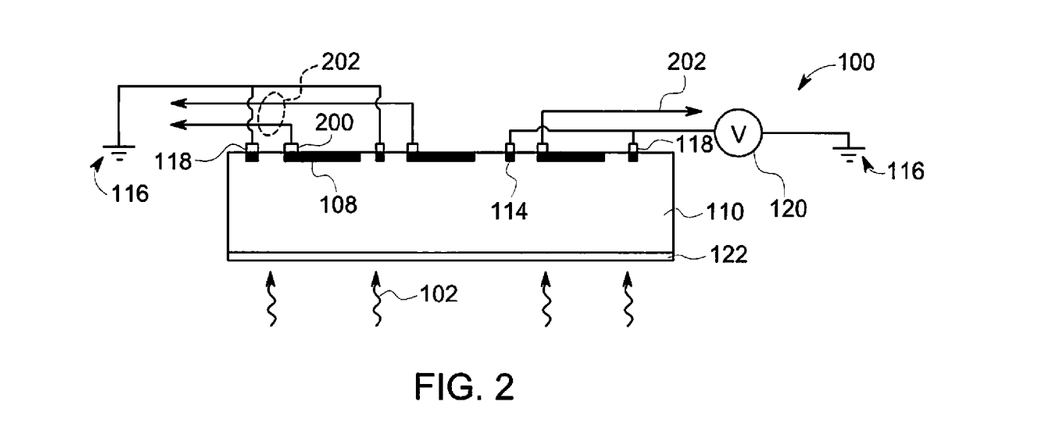
FIG. 2 is a cross-sectional view of the photodiode assembly shown in FIG. 1.

FIG. 1 is a perspective view of one embodiment of a portion of a photodiode assembly 100. FIG. 2 is a cross-sectional view of the photodiode assembly 100 shown in FIG. 1. The photodiode assembly 100 is a radiation detection device that can be used as an image detector, such as a detector for a CT imaging system or a security system. For example, the photodiode assembly 100 may receive incident radiation 102, such as x-rays or light from a photoscintillator and attenuated x-rays used to image a body, on a light entry side 104 of the photodiode assembly 100. The photodiode assembly 100 includes an array 106 of photodiode cells 108. The photodiode cells 108 generate electrical signals or charges in response to photons of the radiation 102 striking the photodiode assembly 100. The signals or charges may be read out or examined to generate an image based on the strength or magnitude of the radiation 102 that is incident on the photodiode assembly 100 at the various photodiode cells 108. For example, the photodiode cells 108 can be conductively coupled with readout electrodes 200 (shown in FIG. 2) that are conductively coupled with conductive busses 202 (shown in FIG. 2). The busses 202 convey the signals or charges to a computing device or processor that generates an image based on the signals or charges.

The photodiode assembly 100 includes a semiconductor substrate 110 formed from one or more semiconductor materials. By way of example only, the semiconductor materials of the substrate 110 may include silicon (Si), germanium arsenide (GeAs), cadmium telluride (CdTe), cadmium zinc telluride (CdZnTe or CZT), and the like. The substrate 110 may be an intrinsic semiconductor material that is not doped with any charged dopant, such as an acceptor or p-type dopant (for example, boron (B)), or a donor or n-type dopant (for example, phosphorus (P)). Alternatively, the substrate 110 may be doped with one of the oppositely charged p- or n-type dopants.

The photodiode cells 108 may be formed by depositing and/or diffusing (collectively referred to herein as "diffusing") one or more dopants into the substrate 110 in the areas shown in FIG. 1. For example, p- or n-type dopants may be diffused into the substrate 110 through a back side 112 of the substrate 110 to form the photodiode cells 108. Alternatively, the dopants may be diffused into the substrate 110 through an opposite light entry side 104 of the substrate 110 to form the photodiode cells 108. In one embodiment, the substrate 110 is doped with an n-type dopant, such as phosphorus (P), and the photodiode cells 108 are formed by diffusing an oppositely charged p-type dopant, such as boron (B), into the substrate 110. Alternatively, the photodiode cells 108 may be formed by etching the substrate 110 to form voids and filling the voids with doped semiconductor material to form the photodiode cells 108. The diffusion of the dopants into the substrate 110 forms dopant junctions, such as p/n dopant junctions (for example, when a p-type dopant is diffused into an n-doped substrate 110) and/or n/p dopant junctions (for example, when an n-type dopant is diffused into a p-doped substrate 110).

The dopants may be diffused in a variety of depths into the substrate 110 to form the photodiode cells 108. By way of example only, the dopants may be diffused to a depth of between approximately 0.05 micrometers and approximately 50 micrometers into the substrate 110 from the back side 112 of the substrate 110. The photodiode cells 108 are shown as square shapes. Alternatively, the photodiode cells 108 may have a different shape, such as a hexagon, octagon, triangle, circle, ellipsis, parallelogram, among other shapes.

The photodiode assembly 100 includes guard bands 114 at least partially extend around the outer periphery of the photodiode cells 108. For example, as shown in FIG. 1, the guard bands 114 may be arranged in a regularly spaced grid and disposed between neighboring photodiode cells 108 along orthogonal or perpendicular directions. The guard bands 114 can be formed by diffusing a dopant, such as a p- or n-type dopant, into the substrate 110. Alternatively, the guard bands 114 may be formed by etching trenches in the substrate 110 and depositing a doped semiconductor in the substrate 110. In one embodiment, the guard bands 114 are formed by diffusing the same type of dopant from which the photodiode cells 108 are formed. For example, in an n-doped substrate 110, the photodiode cells 108 and the guard bands 114 are formed by diffusing a p-type dopant into the substrate 110. Diffusing the dopants to form the guard bands 114 creates dopant junctions in the substrate 110, such as p/n and/or n/p dopant junctions. The dopants may be diffused in a variety of depths into the substrate 110 to form the guard bands 114. By way of example only, the dopants may be diffused to a depth of between approximately 0.20 micrometers and approximately 50 micrometers into the substrate 110 from the film side 112 of the substrate 110.

The guard bands 114 reduce the amount of electrical crosstalk that is conducted, or drifts, between neighboring photodiode cells 108 (e.g., adjacent cells). In one embodiment, the guard bands 114 are conductively coupled with a signal ground reference 116. For example, the guard bands 114 may be joined to one or more conductive ground electrodes 118 that are conductively coupled with the signal ground reference 116. Electrical crosstalk that reaches the guard bands 114 is conveyed to the ground reference so that the crosstalk is not conducted to the neighboring photodiode cells 108. For example, electrons and/or holes in the semiconductor material of the photodiode cells 108 that are not read out as an image signal from the photodiode cells 108 may drift through the substrate 110 out of the photodiode cells 108. The electrons and/or holes may continue to move through the lattice structure of the substrate 110 until the electrons and/or holes reach the guard bands 114 and are conducted to the ground reference 116.

Alternatively, one or more of the guard bands 114 may be conductively coupled with an adjustable voltage source 120, such as a battery, direct current source, or other source of current, that applies an adjustable biasing voltage to the guard bands 114. The biasing voltage can be manually or automatically varied or changed. The biasing voltage can be applied to the guard bands 114 to offset or eliminate the electrons and/or holes that drift from the photodiode cells 108 to the guard bands 114. For example, the biasing voltage may change the effective charge or electric potential of the guard bands 114. Changing the effective charge or potential of the guard bands 114 may alter the effective depth and/or width of the guard bands 114. For example, applying a negative potential or voltage to the guard bands 114 may cause the guard bands 114 to attract less holes and thereby effectively decrease the effective depth and/or width of the guard bands 114. Conversely, applying a positive potential or voltage to the guard bands 114 may cause the guard bands 114 to attract more holes and thereby increase the effective depth and/or width of the guard bands 114. For example, if the electrical crosstalk generated by the photodiode cells 108 is approximately +10 millivolts, then an offset biasing voltage of approximately −10 millivolts may be supplied to the guard bands 114 by the voltage source 120 to offset and/or neutralize the electrical crosstalk that reaches the guard bands 114.

In one embodiment, the photodiode assembly 100 includes a backside passivation layer 122 on the incident side 104 of the substrate 110. The passivation layer 122 is a layer that chemically and/or electrically passivates the substrate 110. For example, the passivation layer 122 may be diffused onto the substrate 110 to prevent contaminants from diffusing into the substrate 110 through the incident side 104, to prevent chemical reactions between the substrate 110 and other chemical species at the incident side 104, and/or to prevent conductive contact between the incident side 104 and another body. The passivation layer 122 may be diffused as a layer of silicon dioxide ($SiO_2$) and/or silicon nitride ($Si_3N_4$), or another chemically and/or electrically passivating substance. The passivation layer 122 also may enhance photon transmission for collection of photons in the photodiode cells 108. The thickness of the passivation layer 122 may be approximately 0.01 micrometers to approximately 5 micrometers. Alternatively, a smaller or larger thickness may be used. Combinations of silicon dioxide and silicon nitride also may be used.

FIGS. 3 through 10 illustrate bottom and cross-sectional views of several embodiments of a photodiode assembly. The embodiments shown in FIGS. 3 through 10 may operate similar to the photodiode assembly 100 shown in FIGS. 1 and 2. For example, the photosensor assemblies include photodiode cells that convert incident radiation into electric signals or charges which are read out to generate an image. The photosensor assemblies include guard bands and ground diffusion regions that reduce or eliminate drift of electrons and/or holes between neighboring photodiode cells. The photosensor assemblies may include a greater number of photodiodes, guard bands, and/or ground diffusion regions than what is shown in the Figures.

Figure 3:
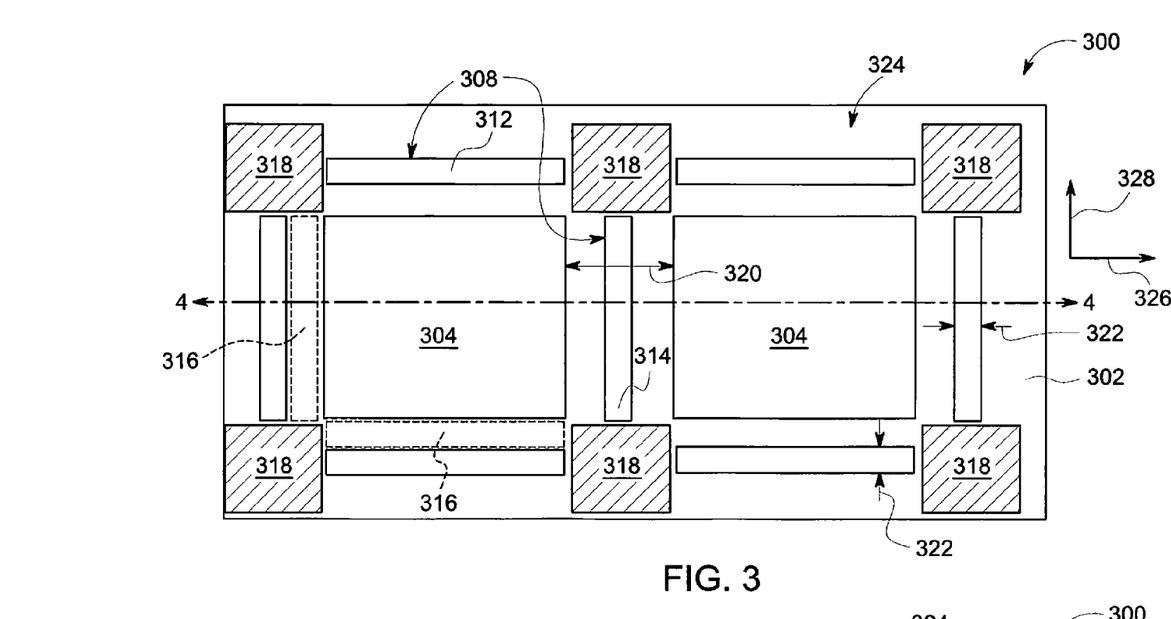
FIG. 3 is a top view of another embodiment of a photodiode assembly.
Figure 4:
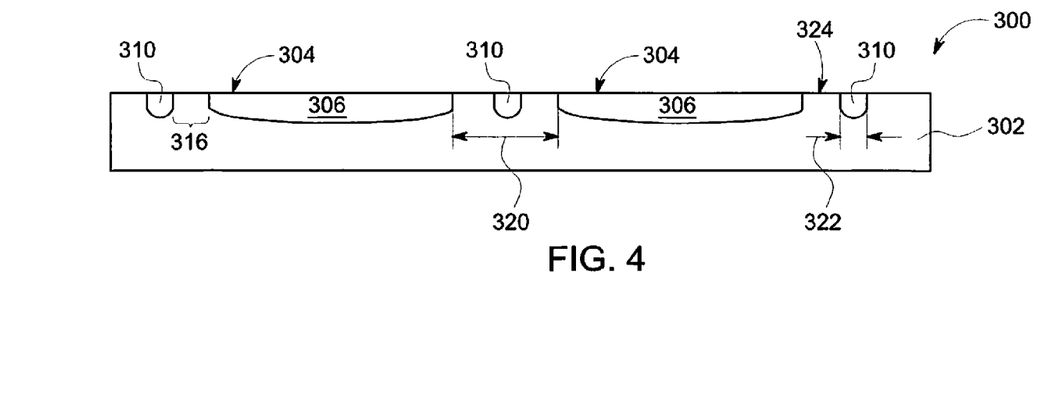
FIG. 4 is a cross-sectional view of the photodiode assembly along line 4-4 in FIG. 3.

FIG. 3 is a top view of one embodiment of a portion of a photodiode assembly 300. FIG. 4 is a cross-sectional view of the portion of the photodiode assembly 300 along line 4-4 in FIG. 3. The photodiode assembly 300 includes a semiconductor substrate 302, such as a p-doped, n-doped, or intrinsic silicon (Si) substrate. In one embodiment, the substrate 302 is an n-doped semiconductor substrate. Alternatively, the substrate 302 may be formed from another semiconductive material.

The substrate 302 includes photodiode cells 304 that convert incident radiation into electric signals or charges. The photodiode cells 304 may be arranged in a regularly spaced array of photodiode cells 304. The photodiode cells 304 include, or are formed from, doped volumes 306 of the substrate 302. In one embodiment, the volumes 306 of the substrate 302 may be doped to form a dopant junction in the substrate 302, with the dopant junctions forming the photodiode cells 304. In one embodiment, the photodiode cells 304 are formed by diffusing a p-type dopant, such as boron (B), into the volumes 306 of the substrate 302 to form a p/n junction. In another embodiment, the photodiode cells 304 are formed by diffusing another acceptor or p-type dopant into the substrate 302. Alternatively, the photodiode cells 304 may be formed by removing the volumes 306 from the substrate 302 (such as by etching) and depositing a doped semiconductor into the volumes 306. In another embodiment, the photodiode cells 304 are formed by diffusing an n-type dopant into the substrate 302.

Although not shown in FIG. 4, the photodiode cells 304 may be conductively coupled with readout busses similar to the photodiode cells 108 (shown in FIG. 1) to permit the signals or charges generated by the photodiode cells 304 to be obtained and used to generate an image. The photodiode cells 304 can be positioned relatively close to each other to increase the resolution of images that are obtained using the photodiode assembly 300. A separation distance 320 can represent the spatial separation of the photodiode cells 304 from each other. In one embodiment, the separation distance 320 between neighboring photodiode cells 304 is no greater than 250 micrometers, or 9.8 mils. In another embodiment, the separation distance 320 is no greater than 150 micrometers, or 5.9 mils. Alternatively, the separation distance 320 is no greater than 30 micrometers, or 1.2 mils. Other separation distances 320 are likewise contemplated.

The photodiode assembly 300 includes elongated guard bands 308 that at least partially extend around the outer peripheries of the individual photodiode cells 304. The guard bands 308 include commonly doped collection regions 312, 314. As used herein, the term "commonly doped" is used to identify portions or volumes of the substrate that are doped with the same type of dopants or the same dopants as the photodiode cells. By way of example, if the photodiode cells 304 are formed by doping volumes of the substrate 302 with a p-type or acceptor dopant, such as boron (B), then other volumes of the substrate 302 that are doped with boron (B) or with another p-type or acceptor dopant may be referred to as commonly doped volumes or regions. On the other hand, volumes of the substrate that are doped with phosphorus (P) or with another n-type or donor dopant may be referred to as differently doped volumes or regions. In accordance with one embodiment, the guard bands include commonly doped regions of the substrate.

The collection regions 312 may be referred to as horizontal regions and the collection regions 314 may be referred to as vertical regions. Additionally, as used herein, the terms "horizontal" and "vertical" merely denote the orientation of different diffused regions in a substrate and are not intended to limit all embodiments of the disclosed subject matter. For example, the collection regions 312, 314 may be oriented in other directions. While the collection regions 312, 314 are perpendicularly oriented with respect to each other in the illustrated embodiment, alternatively, the collection regions 312, 314 may be obliquely oriented with respect to each other (e.g., oriented at an angle other than ninety degrees). For example, the collection regions 312, 314 may be oriented in transverse, or non-parallel, angles with respect to each other.

In the illustrated embodiment, the commonly doped collection regions 312, 314 are separated from each other. The vertical collection regions 314 are disposed between neighboring photodiode cells 304 along a first direction 326 and the horizontal collection regions 312 are disposed between neighboring photodiode cells 304 along a second, orthogonal or perpendicular direction 328 in the illustrated embodiment. As shown in FIG. 3, the collection regions 312, 314 are spaced apart such that the collection regions 312, 314 are not directly coupled with each other (e.g., the regions 312, 314 do not abut each other).

The collection regions 312, 314 of the guard bands 308 include, or are formed from, doped volumes 310 of the substrate 302. The volumes 310 of the substrate 302 are doped with an n- or p-type dopant to form a dopant junction in the substrate 302, with the dopant junctions forming the collection regions 312, 314. In one embodiment, the individual and separate segments of the guard bands 308 that form the collection regions 312, 314 are created by diffusing the same type of dopant as the photodiode cells 304. For example, the photodiode cells 304, the horizontal collection segments 312, and the vertical collection segments 314 may be formed by diffusing a p-type dopant, such as boron (B), into the volumes 306 and the volumes 310 of the substrate 302. Alternatively, the collection segments 312, 314 may be formed by removing the volumes 310 from the substrate 302 (such as by etching) and diffusing a doped semiconductor into the volumes 310.

In the illustrated embodiment, ground diffusion regions 318 are disposed at or near the corners of the photodiode cells 304. For example, the ground diffusion regions 318 may be disposed between neighboring photodiode cells 304 along directions that are obliquely angled with respect to the directions 326, 328. In the embodiment shown in FIG. 3 where the guard bands 308 have a square shape, the ground diffusion regions 318 may be located at the corners of the square shapes approximately formed by the guard bands 308 with the collection regions 312, 314 forming the sides of the square guard bands 308. Alternatively, the guard bands 308 may have a different shape, such as a hexagon, octagon, triangle, circle, ellipsis, parallelogram, and the like.

The ground diffusion regions 318 include, or are formed from, volumes of the substrate 302 that are doped with an n- or p-type dopant. In one embodiment, the ground diffusion regions 318 represent doped volumes of the substrate 302 that form a dopant junction in the substrate 302. The ground diffusion regions 318 may be formed using an oppositely charged dopant as the photodiode cells 304 and/or the collection regions 312, 314. For example, the ground diffusion regions 318 may be formed from n-doped volumes of the substrate 302 while the photodiode cells 304 and the collection regions 312, 314 are formed from p-doped volumes of the substrate 302.

Similar to the guard bands 114 (shown in FIG. 1), the guard bands 308 may be conductively coupled with a ground reference similar to the guard bands 114 (shown in FIG. 1). For example, the ground diffusion regions 318 may be coupled with the signal ground reference and the collection regions 312, 314 may be joined with the ground diffusion regions 318. Alternatively, both the ground diffusion regions 318 and the collection regions 312, 314 may be joined to a common conductive ground electrode. The collection regions 312, 314 may be coupled with the ground diffusion regions 318 by diffusing the collection regions 312, 314 and ground diffusion regions 318 adjacent to each other. Alternatively or additionally, conductive bodies or busses may be provided that contacts the collection regions 312, 314 with the diffusion regions 318 by metalizing a connection between the regions 312, 314, 318.

Electrical crosstalk (e.g., electrons and/or holes) may be generated by the photodiode cells 304. The holes of the crosstalk may drift to the collection regions 312, 314 and/or the ground diffusion regions 318. The holes are attracted to the collection regions 312, 314 but are repelled by the ground diffusion regions 318 in one embodiment. The repulsion by the ground diffusion regions 318 may direct at least some of the holes toward the collection regions. The electrons of the crosstalk may drift to the ground diffusion regions 318. The holes are conducted to the ground reference by being conducted through the collection regions 312, 314 to the ground diffusion regions 318, and then to the electric ground reference. The electrons are conducted to the ground reference by being conducted through the ground diffusion regions 318 to the ground reference.

In the illustrated embodiment, the substrate 302 extends between and separates the guard bands 308 from the photodiode cells 304, without any other diffused regions or junctions disposed between the photodiode cells 304 and the guard bands 308. For example, the substrate 302 may continuously extend from outer peripheries of a photodiode cell 304 to the collection regions 312, 314 of the guard bands 308 disposed between the photodiode cell 304 and neighboring photodiode cells 304. By "continuously extend," the substrate 302 may be disposed between the photodiode cells 304 and the guard bands 308 such that no doped regions, dopant junctions, and/or etched volumes are located in the substrate 302 between the photodiode cells 304 and the guard bands 308 that separate the photodiode cells 304 from neighboring photodiode cells 304. The substrate 302 may extend, without interruption or inclusion of additional doped volumes, from the photodiode cells 304 to the guard bands 308. The volumes or sections of the substrate 302 that separate and extend from the photodiode cells 304 to the guard bands 308 may be referred to as separation regions 316 of the substrate 302. Electrical crosstalk may pass through the separation regions 316 from the photodiode cells 304 to the guard bands 308 and be conducted to the signal ground reference by the guard bands 308.

The width of the guard bands 308 can be varied to change the how much of the crosstalk signals generated by the photodiode cells 304 are captured by the guard bands 308 and conducted to the signal ground reference. For example, a width dimension 322 may represent the lateral width or size of the horizontal and/or vertical collection regions 312, 314 of the guard bands 308 at a film side 324 of the substrate 302. Increasing the width dimension 322 may allow the guard bands 308 to capture larger crosstalk signals (e.g., crosstalk signals having larger amounts of energy) relative to smaller width dimensions 322. In one embodiment, the width dimension 322 is no greater than 100 micrometers, or 3.9 mils. In another embodiment, the width dimension 322 is no greater than 50 micrometers, or 2.0 mils. Alternatively, the width dimension 322 is no greater than 1 micrometer, or 0.04 mils. The sizes of the ground diffusion regions 318 similarly may be adjusted to vary the magnitude of crosstalk signals that is conducted to the signal ground reference.

Figure 5:
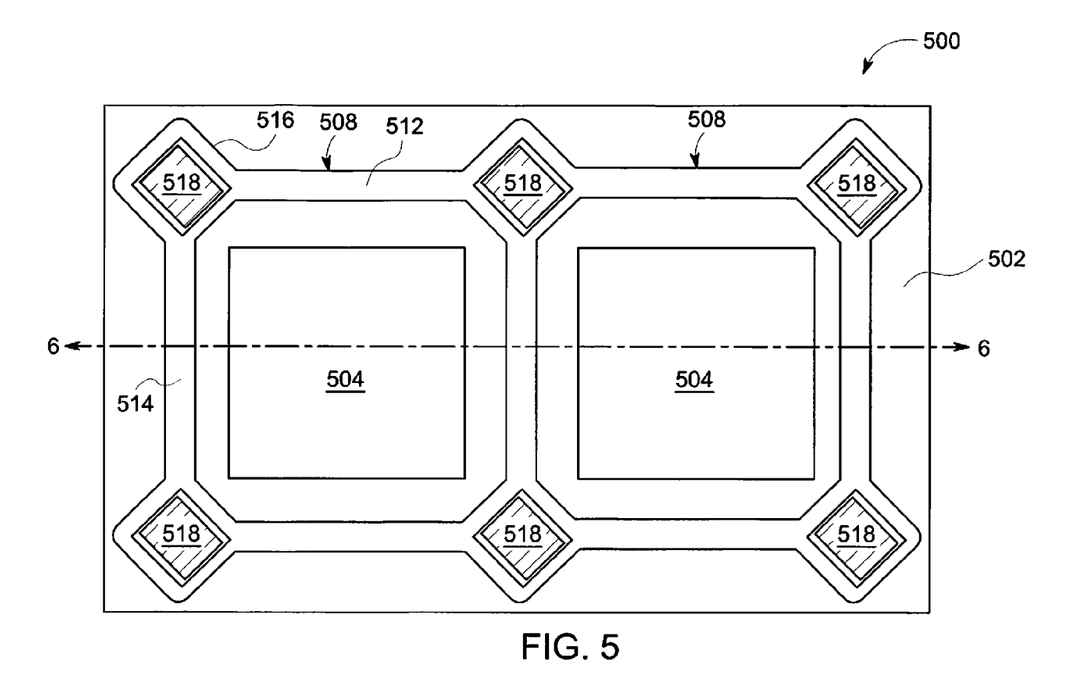
FIG. 5 is a top view of a photodiode assembly according to another embodiment.
Figure 6:
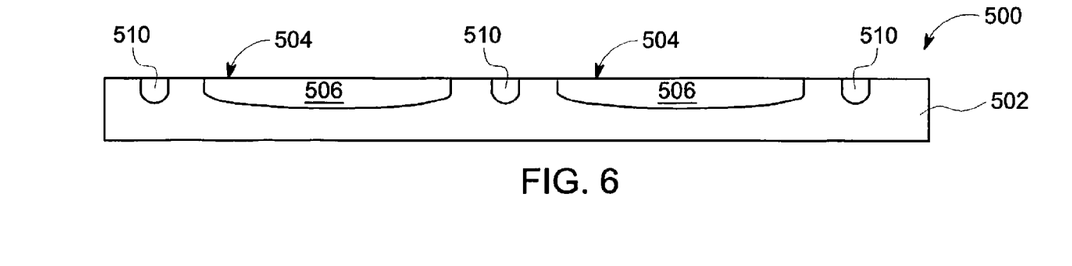
FIG. 6 is a cross-sectional view of the photodiode assembly along line 6-6 in FIG. 5.

FIG. 5 is a top view of a portion of a photodiode assembly 500 according to another embodiment. FIG. 6 is a cross-sectional view of the photodiode assembly 500 along line 6-6 in FIG. 5. Similar to the photodiode assembly 100 (shown in FIG. 1), the photodiode assembly 500 includes a semiconductor substrate 502, such as a p-doped, n-doped, or intrinsic semiconductor substrate. In one embodiment, the substrate 502 is an n-doped silicon (Si) substrate.

The substrate 502 includes photodiode cells 504 that include, or are formed from, volumes 506 of the substrate 502 that are doped with an n- or p-type dopant. In one embodiment, the photodiode cells 504 are formed from p-doped volumes 506 of the substrate 502. The photodiode cells 504 may be conductively coupled with readout busses similar to the photodiode cells 108 (shown in FIG. 1) to permit the signals or charges generated by the photodiode cells 504 to be obtained and used to generate an image.

The photodiode assembly 500 includes encircling guard bands 508 that at least partially extend around the outer peripheries of the individual photodiode cells 504. In the illustrated embodiment, the guard bands 508 continuously extend around the outer peripheries of the photodiode cells 504. The guard bands 508 include commonly doped volumes of the substrate 502 in one embodiment. For example, the guard bands 508 may include, or be formed from, volumes 510 of the substrate 502 that are doped with the same dopant or same type of dopant as the photodiode cells 504. The commonly doped volumes may be referred to as collection regions.

The guard bands 508 may surround the photodiode cells 504 such that the guard bands 508 are disposed between neighboring photodiode cells 504. In the illustrated embodiment, the guard bands 508 include commonly doped collection regions 512 and commonly doped interconnecting regions 516. The collection regions 512, 514 include horizontal and vertical collection regions 512, 514 that may be formed from the same type of dopant used to create the photodiode cells 504. For example, the photodiode cells 504 and the collection regions 512, 514 may be formed by diffusing a p-type dopant, such as boron (B), into the substrate 502 while the ground diffusion regions 518 are formed by diffusing an n-type dopant, such as phosphorus (P), into the substrate 502.

The substrate 502 includes ground diffusion regions 518 that include volumes of the substrate 502 that are doped with a different or oppositely charged dopant relative to the dopant (s) used to create the photodiode cells 504 and/or the collection and interconnecting regions 512, 514, 516. For example, the ground diffusion regions 518 may be formed by diffusing an n-type dopant (such as phosphorus) into the substrate 502. The ground diffusion regions 518 may be conductively coupled with an electric ground reference. For example, one or more conductive ground electrodes may conductively couple the ground diffusion regions 518 with a ground reference.

In contrast to the photodiode assembly 300 (shown in FIG. 3), the collection regions 512, 514 of the guard bands 508 are coupled with each other. For example, the collection regions 512, 514 are coupled with each other by the interconnecting regions 516 of the guard bands 508 such that the collection regions 512, 514 and interconnecting regions 516 form a continuous body that encircles the photodiode cell 504. The interconnecting regions 516 may be extensions of the horizontal and/or vertical collection regions 512, 514 that join the horizontal and vertical collection regions 512, 514. As shown in FIG. 5, the interconnecting regions 516 couple the collection regions 512, 514 such that the horizontal, vertical, and interconnecting regions 512, 514, 516 entirely encircle the ground diffusion regions 518 (as shown in FIG. 5) in one embodiment.

Similar to the photodiode assembly 300 shown in FIG. 3, the substrate 502 extends between and separates the guard bands 508 from the photodiode cells 504. The substrate 502 may continuously extend from outer peripheries of a photodiode cell 504 to the collection and interconnecting regions 512, 514, 516 of the guard bands 508 that at least partially surround the photodiode cell 504 and separate the photodiode cell 504 from neighboring photodiode cells 504.

Also similar to the photodiode assembly 300 (shown in FIG. 3), the ground diffusion regions 518 may be conductively coupled with the signal ground reference. The interconnecting regions 516 may abut or overlap the ground diffusion regions 518 such that the interfaces between the ground diffusion regions 518 and the interconnecting regions 518 form a dopant junction. Electrical crosstalk signals from the photodiode cells 504 may be conducted through the substrate 502 to the horizontal and/or vertical collection regions 512, 514. The collection regions 512, 514 may be doped so as to be more conductive than the substrate 502. As a result, the crosstalk signals in the collection regions 512, 514 may be conducted to the ground diffusion regions 518 via the interconnecting regions 516. The ground diffusion regions 518 may then conduct the crosstalk signals to the ground reference.

Figure 7:
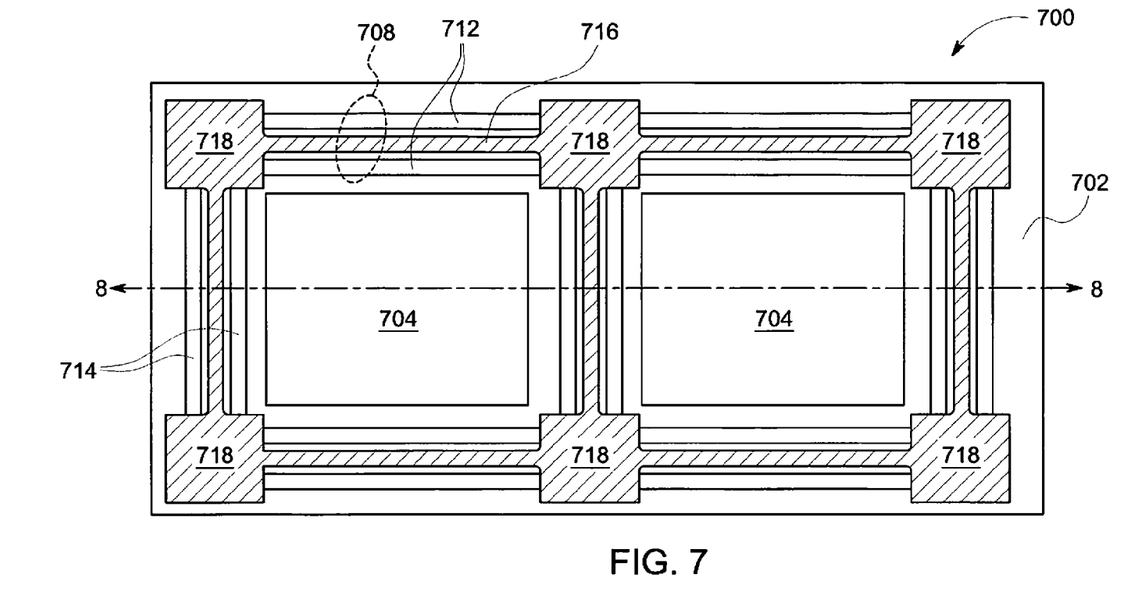
FIG. 7 is a top view of a photodiode assembly according to another embodiment.
Figure 8:
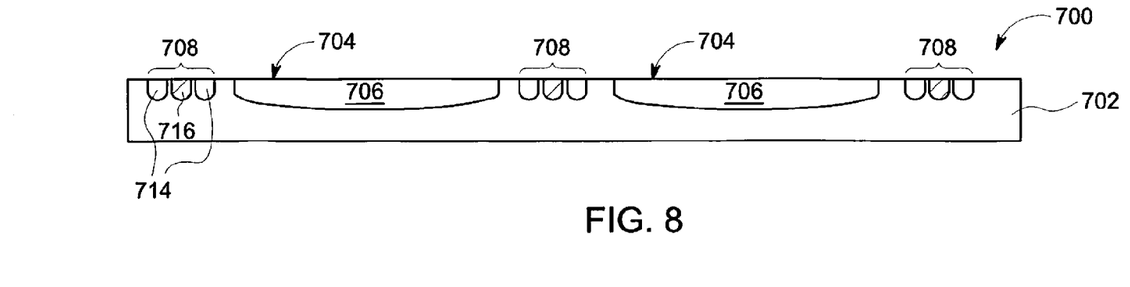
FIG. 8 is a cross-sectional view of the photodiode assembly along line 8-8 in FIG. 8.

FIG. 7 is a top view of a portion of a photodiode assembly 700 according to another embodiment. FIG. 8 is a cross-sectional view of the photodiode assembly 700 along line 8-8 in FIG. 8. Similar to the photodiode assembly 100 (shown in FIG. 1), the photodiode assembly 700 includes a semiconductor substrate 702, such as a p-doped, n-doped, or intrinsic semiconductor substrate. In one embodiment, the substrate 702 is an n-doped silicon (Si) substrate.

The substrate 702 includes photodiode cells 704 that include, or are formed from, volumes 706 of the substrate 702 that are doped with an n- or p-type dopant. In one embodiment, the photodiode cells 704 are formed from p-doped volumes 706 of the substrate 702. The photodiode cells 704 may be conductively coupled with readout busses similar to the photodiode cells 108 (shown in FIG. 1) to permit the signals or charges generated by the photodiode cells 704 to be obtained and used to generate an image.

The photodiode assembly 700 includes individual cell guard bands 708 that at least partially extend around the outer peripheries of the individual photodiode cells 704. Similar to the guard bands 108, 308, 508 (shown in FIGS. 1, 3, and 5), the guard bands 708 separate individual photodiode cells 704 from each other. In the illustrated embodiment, the guard bands 708 include elongated commonly doped collection regions 712, 714. The collection regions 712, 714 include horizontal collection regions 712 and vertical collection regions 714. As described above, the commonly doped collection regions 712 714 can be formed by diffusing the same type or charged dopant as the dopant that is used to form the photodiode cells 704 (e.g., a p-dopant).

The photodiode assembly 700 also includes elongated interior ground diffusion regions 716 and ground diffusion regions 718. The ground diffusion regions 716, 718 include volumes of the substrate 702 that are doped with a different type or oppositely charged dopant relative to the dopant(s) used to form the collection regions 712, 714 and/or the photodiode cells 704. For example, the ground diffusion regions 716, 718 may be formed as n-doped volumes of the substrate 702. In one embodiment, the ground diffusion regions 716, 718 are collectively coupled with the signal ground reference of the assembly 700. As shown in FIG. 7, the elongated interior ground diffusion regions 716 interconnect the ground diffusion regions 718 such that the ground diffusion regions 716, 718 encircle each of the photodiode cells 704 shown in FIG. 7.

The collection regions 712, 714 are disposed on opposite sides of the interconnecting regions 716. For example, the interconnecting regions 716 may be disposed between the horizontal collection regions 712 in a pair of horizontal collection regions 712 and between the vertical collection regions 714 in a pair of vertical collection regions 714. As shown in FIG. 7, each pair of horizontal collection regions 712 and each pair of vertical collection regions 714 includes one horizontal or vertical collection region 712, 714 disposed closer to the photodiode cell 704 than the interconnecting regions 716 and one horizontal or vertical collection region 712, 714 disposed farther from the photodiode cell 704 than the interconnecting regions 716.

The ground diffusion regions 718 are spaced apart from each other along the outer periphery of each photodiode cell 704 in the illustrated embodiment. The interconnecting regions 716 may extend between and couple the ground diffusion regions 718 that extend around the photodiode cell 704. The interior collection regions 712, 714 can extend between and couple the neighboring ground diffusion regions 718. In the illustrated embodiment, the interior collection regions 712, 714 are not joined with each other. Alternatively, the ground diffusion regions 718 may be de-coupled or spatially separated from one or more of the interconnecting regions 716, horizontal collection regions 712, and/or vertical collection regions 714. As shown in FIG. 7, the ground diffusion regions 718 and interconnecting regions 716 at least partially encircle the photodiode cells 704 and the interior collection regions 712, 714. For example, the interior collection regions 712, 714 are disposed between the interconnecting regions 716 and the photodiode cell 704.

The substrate 702 may continuously extend between and separate the horizontal and vertical collection regions 712, 714 of the guard bands 708 from the photodiode cells 704. For example, the substrate 702 may continuously extend from outer peripheries of a photodiode cell 704 to the interior collection regions 712, 714 without any other doped regions or junctions disposed within the substrate 702 therebetween. The interior collection regions 712, 714 are spaced apart from the interconnecting regions 716. For example, the substrate 702 may continuously extend between and separate the horizontal collection regions 712 from the interconnecting regions 716 and between the vertical collection regions 714 from the interconnecting regions 716.

The ground diffusion regions 718 may be conductively coupled with a signal ground reference to conduct electrons drifting from the photodiode cells 704 to the signal ground reference. The guard bands 708 may be coupled with the ground diffusion regions 718. As a result, holes that drift from the photodiode cells 704 may drift to and be collected in the horizontal and vertical collection regions 712, 714. Crosstalk signals from the photodiode cells 704 may be conducted through the substrate 702 to the interior horizontal and/or vertical collection regions 712, 714. The crosstalk signals in the interior collection regions 712, 714 may be conducted to the signal ground reference via the ground diffusion regions 718. Alternatively, at least some of the crosstalk signals may be conducted from the horizontal and/or vertical collection regions 712, 714 to the interconnecting regions 716, and from the interconnecting regions 716 to the signal ground reference through the ground diffusion regions 718.

Figure 9:
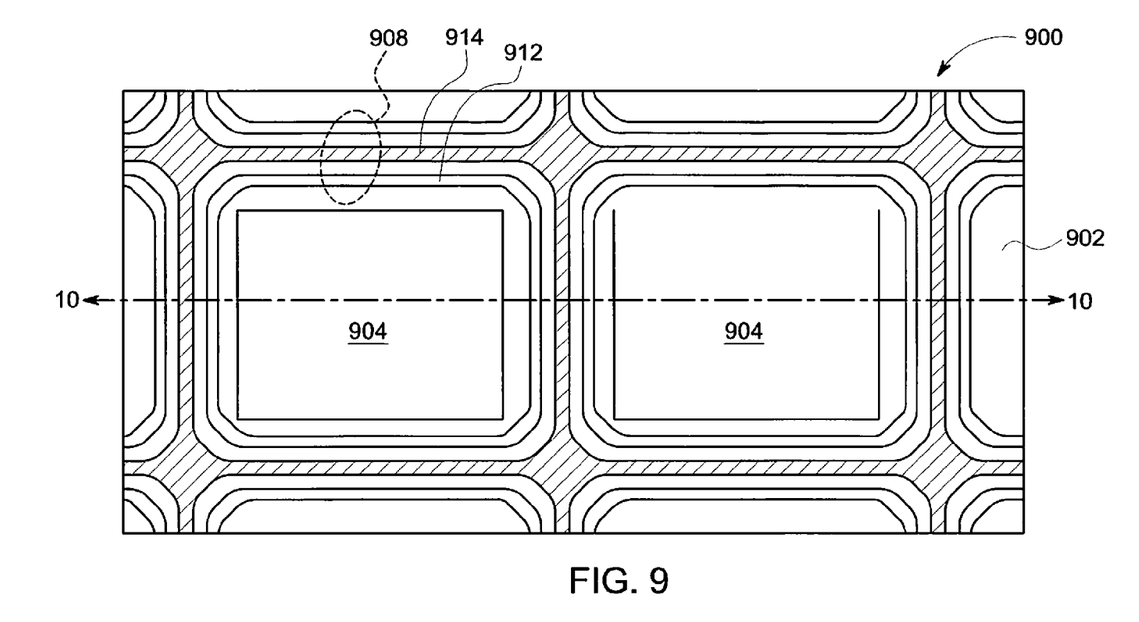
FIG. 9 is a top view of a photodiode assembly according to another embodiment.
Figure 10:
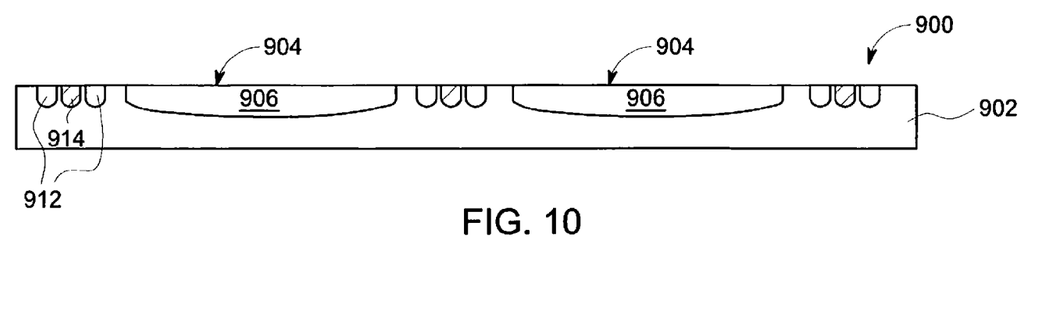
FIG. 10 is a cross-sectional view of the photodiode assembly along line 10-10 in FIG. 9.

FIG. 9 is a top view of a portion of a photodiode assembly 900 according to another embodiment. FIG. 10 is a cross-sectional view of the photodiode assembly 900 along line 10-10 in FIG. 9. Similar to the photodiode assembly 100 (shown in FIG. 1), the photodiode assembly 900 includes a semiconductor substrate 902, such as a p-doped, n-doped, or intrinsic semiconductor substrate. In one embodiment, the substrate 902 is an n-doped silicon (Si) substrate.

The substrate 902 includes photodiode cells 904 that include, or are formed from, volumes 906 of the substrate 902 that are doped with an n- or p-type dopant. In one embodiment, the photodiode cells 904 are formed from p-doped volumes 906 of the substrate 902. The photodiode cells 904 may be conductively coupled with readout busses similar to the photodiode cells 108 (shown in FIG. 1) to permit the signals or charges generated by the photodiode cells 904 to be obtained and used to generate an image.

The photodiode assembly 900 includes concentric guard bands 908 that at least partially extend around the outer peripheries of the individual photodiode cells 904. Similar to the guard bands 108, 308, 508, 708 (shown in FIGS. 1, 3, 5, and 7), the guard bands 908 separate individual photodiode cells 904 from each other. In the illustrated embodiment, the guard bands 908 include a commonly doped interior collection region 912 that encircles the photodiode cell 904. A differently doped ground diffusion region 914 encircles the interior collection region 912. Alternatively, the interior collection region 912 may include a separation, gap, or break such that the interior collection region 912 does not entirely encircle the photodiode cell 904 and/or the ground diffusion region 914 may include a separation, gap, or break such that the ground diffusion region 914 does not entirely encircle the interior collection region 912.

The interior collection regions 912 may be formed from the same type of dopant used to create the photodiode cells 904 (e.g., a p-type dopant) while the ground diffusion regions 914 may be formed from the opposite dopant (e.g., an n-type dopant). As described above, one or more of the regions 912, 914 may be formed by diffusing dopants into volumes of the substrate 902 and/or by etching the substrate 902 and diffusing a doped semiconductor into the substrate 902.

The interior collection regions 912 are spaced apart from the diffusion band regions 914 by the substrate 902 in the illustrated embodiment. For example, the substrate 902 may continuously extend between and separate the interior collection regions 912 from the diffusion band regions 914. Alternatively, one or more of the interior collection regions 912 may abut or contact one or more of the diffusion band regions 914. The substrate 902 can continuously extend between and separate the guard bands 908 from the photodiode cells 904. For example, the substrate 902 may continuously extend from outer peripheries of a photodiode cell 904 to the interior collection region 912 of the guard band 908 with no dopant diffused regions or dopant junctions in the substrate 902 between the photodiode cells 904 and the collection regions 912.

The collection regions 912 and the ground diffusion regions 914 may be conductively coupled with a ground reference to conduct electrons and/or holes that drift from the photodiode cells 904 to the ground reference in one embodiment. For example, the ground diffusion band regions 914 may be conductively coupled with an electrode that is coupled with a signal ground reference. The collection regions 912 may be joined with the ground diffusion band regions 914 and/or be conductively coupled with the same electrode that couples the ground diffusion band regions 914 to the ground reference. The holes that drift out of the photodiode cells 904 may be collected by the collection regions 912 and conveyed to the ground reference. The electrons that drift out of the photodiode cells 904 may be collected by the ground diffusion regions 914 and conducted to the ground reference.

Figure 11:
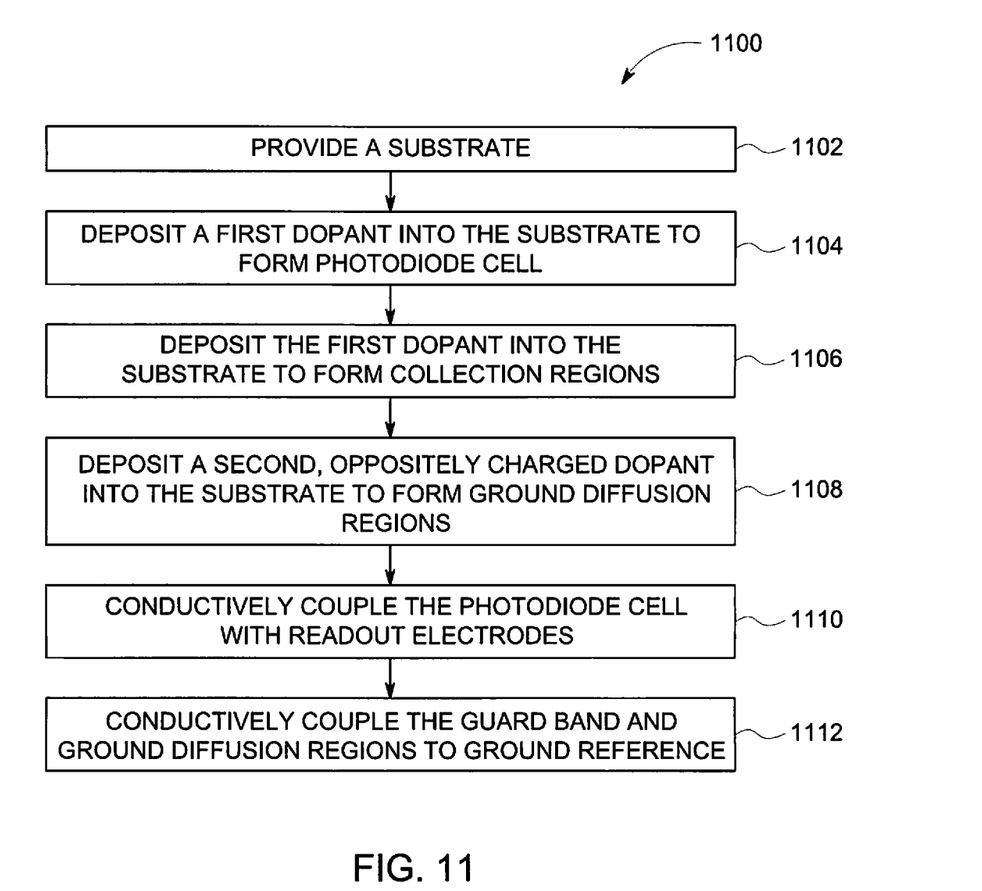
FIG. 11 is a flowchart of one embodiment for a method for providing a photodiode assembly.

FIG. 11 is a flowchart of one embodiment for a method 1100 for providing a photodiode assembly. The method 1100 may be used to fabricate one or more of the photosensor assemblies 100, 300, 500, 700, 900 (shown in FIGS. 1, 3, 5, 7, and 9) described above. At 1102, a substrate is provided. For example, a semiconductor substrate such as one or more of the substrate 110, 302, 502, 702, 902 (shown in FIGS. 1, 3, 5, 7, and 9) may be provided.

At 1104, a first dopant is diffused into the substrate to form one or more photodiode cells. For example, a p-type dopant such as boron (B) may be diffused into the substrate to form photodiode cells. The photodiode cells may be arranged in a regularly spaced grid or array.

At 1106, the first dopant is diffused into the substrate to form a first part of a guard band. For example, the first dopant or a dopant of the same charge type as the dopant that was used to form the photodiode cells is diffused into the substrate in one or more locations that are spaced apart from the photodiode cells to form collection regions. The first dopant is diffused into the locations that are spaced apart from the photodiode cells to form a first part of the guard band. The photodiode cells and the first part of the guard band may be formed concurrently by masking the substrate and diffusing the first type of dopant into different areas that correspond with the photodiode cells and the first part of the guard band.

At 1108, a second, oppositely charged dopant is diffused into the substrate to form a ground diffusion region of the substrate. For example, a second dopant that has a charge that is opposite of the charge of the first dopant is diffused into the substrate. The second dopant can be an n-type dopant, such as phosphorus (P). The second dopant is diffused in locations of the substrate that are located farther from the photodiode cells than the parts of the guard band that are formed from the first dopant in one embodiment.

At 1110, the photodiode cells are conductively coupled with readout electrodes. For example, the photodiode cells may be coupled to electrodes that are conductively coupled with readout electronics. The readout electronics can determine the size or magnitude of the electrical charged that are formed by the photodiode cells when incident radiation strikes the photodiode cells to create an image, as described above.

At 1112, the guard band and the ground diffusion region are conductively coupled with a ground reference. For example, one or more electrodes may be coupled to the guard band and/or the collection regions. The electrodes can be joined with the ground reference within the semiconductor substrate. The electrodes are conductive coupled with the signal ground reference in order to convey electrical crosstalk from the photodiode cells to the ground reference. For example, the guard band may be disposed between the photodiode cells such that electrical crosstalk that drifts from the photodiode cells is conducted to the ground reference by the guard band before the electrical crosstalk reaches a neighboring photodiode cell.

In accordance with one or more embodiments, a method for providing a photodiode assembly is disclosed. The method may be used to fabricate one or more of the photosensor assemblies 100, 300, 500, 700, 900 disclosed herein and shown in FIGS. 1 through 10. The method includes providing a substrate that may be doped with a p- or n-type dopant. The photodiode cells are formed in the substrate by diffusing a dopant into the substrate. The dopant used to form the photodiode cells may be an oppositely charged dopant relative to the dopant in the substrate. For example, a p-type dopant may be used to diffuse the photodiode cells when the substrate is doped with an n-type dopant.

The method also includes forming guard bands around the photodiode cells in the substrate. The guard bands separate individual photodiode cells from each other. The guard bands may be provided by diffusing two or more different types of dopants into the substrate. In one embodiment, the guard bands are provided by forming both commonly doped and differently doped regions in the substrate between neighboring photodiode cells. For example, the guard bands may be provided by diffusing volumes of the substrate with different dopants or different types of dopants than the photodiode cells and by diffusing volumes of the substrate between the differently doped regions and the photodiode cells with commonly doped regions. As shown in FIGS. 1-10, various arrangements and patterns of the photodiode cells and guard bands may be used.

The guard bands prevent, inhibit, or significantly reduce crosstalk signals from one photodiode cell from drifting to a neighboring photodiode cell. The differently doped volumes of the guard bands can be conductively coupled with a signal ground reference. The commonly doped volumes of the guard bands are located between the photodiode cells and the differently doped volumes. The commonly doped volumes can collect crosstalk signals generated by the photodiode cells. The crosstalk signals may be conveyed from the commonly doped volumes to the differently doped volumes, where the crosstalk signals are conducted to the signal ground reference.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the subject matter disclosed herein without departing from its scope. While the dimensions and types of materials described herein are intended to define the parameters of the one or more embodiments of the subject matter, they are by no means limiting and are exemplary embodiments. Many other embodiments will be apparent to one of ordinary skill in the art upon reviewing the above description. The scope of the subject matter described herein should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose several embodiments of the described subject matter, including the best mode, and also to enable one of ordinary skill in the art to practice the embodiments disclosed herein, including making and using any devices or systems and performing the methods. The patentable scope of the subject matter is defined by the claims, and may include other examples that occur to one of ordinary skill in the art. Such other examples are within the scope of the claims if they have structural elements that do not differ from the literal language of the claims, or if they include equivalent structural elements with insubstantial differences from the literal language of the claims.

What is claimed is:

1. A photodiode assembly comprising:
a semiconductor substrate;
a photodiode cell in the substrate, the photodiode cell including a first volume of the substrate that is doped with a first type of dopant;
a ground diffusion region in the substrate, the ground diffusion region including a second volume of the substrate that is doped with a second type of dopant having an opposite charge relative to the first type of dopant; and
a guard band in the substrate and at least partially extending around an outer periphery of the photodiode cell, the guard band including a third volume of the substrate that is doped with the first type of dopant, at least one of the ground diffusion region or the guard band conductively coupled with a ground reference to conduct one or more of electrons or holes that drift from the photodiode cell through the substrate, wherein the guard band is disposed closer to the photodiode cell than the ground diffusion region, and
wherein the commonly doped volume of the guard band is separated from the photodiode cell by a separation portion of the substrate that continuously extends from the photodiode cell to the guard band and that is not doped with the second type of dopant.

2. The photodiode assembly of claim 1, wherein the guard band includes elongated doped regions of the substrate oriented at non-parallel angles with respect to each other.

3. The photodiode assembly of claim 2, wherein the ground diffusion region is joined with the elongated doped regions of the commonly doped volume.

4. The photodiode assembly of claim 2, wherein the ground diffusion region is disposed between the elongated doped regions around the photodiode cell.

5. The photodiode assembly of claim 1, wherein the guard band includes elongated doped regions of the substrate that extend around the photodiode cell and around the ground diffusion region.

6. The photodiode assembly of claim 1, wherein the ground diffusion region includes a plurality of spaced apart ground diffusion regions disposed around the photodiode cells and an elongated ground diffusion region that extends between and couples the spaced apart ground diffusion regions.

7. The photodiode assembly of claim 1, wherein the photodiode cell and the guard band include p-doped regions of the substrate.

8. The photodiode assembly of claim 1, further comprising an adjustable voltage source conductively coupled with the guard band, the guard band configured to receive a biasing voltage from the voltage source.

9. The photodiode assembly of claim 1, wherein the photodiode assembly forms at least a part of a detector in a computed tomography imaging system, a security system, or another imaging system.

10. A photodiode assembly comprising:
a semiconductor substrate;
an array of photodiode cells disposed in the substrate, the photodiode cells including spaced apart volumes of the substrate that are doped with a first type of dopant;
guard bands disposed in the substrate between the photodiode cells, the guard bands including commonly doped volumes of the substrate that are doped with the first type of dopant; and
ground diffusion regions disposed in the substrate farther from the photodiode cells than the guard bands, the ground diffusion regions doped with a different, second type of dopant than the first type of dopant, wherein the guard bands are configured to conduct at least one of electrons or holes drifting through the substrate from the photodiode cells to a ground reference and the ground diffusion regions are configured to conduct the other of electrons or holes drifting through the substrate from the photodiode cells to the ground reference, and
wherein the guard bands are separated from the photodiode cells by separation portions of the substrate that continuously extend from the photodiode cells to the guard bands, the separation portions not including regions doped with the second type of dopant.

11. The photodiode assembly of claim 10, wherein the guard bands include elongated doped regions of the substrate that extend around the photodiode cells and around the ground diffusion regions.

12. The photodiode assembly of claim 10, wherein the ground diffusion regions include a plurality of spaced apart ground diffusion regions disposed around the photodiode cells and one or more elongated ground diffusion regions that extend between and couple the spaced apart ground diffusion regions.

13. The photodiode assembly of claim 10, wherein the guard bands are conductively coupled with a voltage source, the guard band configured to receive a biasing voltage from the voltage source.

* * * * *